(12) United States Patent
Iida

(10) Patent No.: US 7,670,672 B2
(45) Date of Patent: Mar. 2, 2010

(54) MULTILAYER CERAMIC SUBSTRATE AND METHOD FOR PRODUCING SAME

(75) Inventor: Yuichi Iida, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 3 days.

(21) Appl. No.: 12/265,984

(22) Filed: Nov. 6, 2008

(65) Prior Publication Data

US 2009/0053532 A1   Feb. 26, 2009

Related U.S. Application Data

(63) Continuation of application No. PCT/JP2008/055496, filed on Mar. 25, 2008.

(30) Foreign Application Priority Data

Apr. 11, 2007   (JP) .............................. 2007-103439

(51) Int. Cl.
*H05K 3/46* (2006.01)
(52) U.S. Cl. ...................... 428/210; 428/209; 174/258; 174/259; 174/260; 361/760; 361/761; 361/762
(58) Field of Classification Search ................ 428/210, 428/209; 174/255, 258, 259, 260; 361/760–762
See application file for complete search history.

(56) References Cited

U.S. PATENT DOCUMENTS

| 5,122,862 | A | * | 6/1992 | Kajihara et al. ............. 257/704 |
| 5,435,875 | A | * | 7/1995 | Saitoh et al. ................ 156/245 |
| 5,702,985 | A | * | 12/1997 | Burns .......................... 438/119 |
| 6,248,429 | B1 | * | 6/2001 | Akram et al. ................ 428/210 |
| 6,432,239 | B1 | * | 8/2002 | Mandai et al. ............ 156/89.12 |
| 6,455,453 | B1 | * | 9/2002 | Chikagawa .................. 501/120 |
| 6,673,180 | B2 | * | 1/2004 | Harada ..................... 156/89.11 |
| 6,743,316 | B2 | * | 6/2004 | Harada et al. ............. 156/89.11 |
| 6,797,093 | B2 | * | 9/2004 | Moriya et al. ............. 156/89.12 |
| 6,815,046 | B2 | * | 11/2004 | Mandai et al. ............... 428/210 |
| 2001/0047796 | A1 | | 12/2001 | Yamada et al. |
| 2008/0223606 | A1 | | 9/2008 | Tsukizawa et al. |

FOREIGN PATENT DOCUMENTS

| JP | 2001-135933 A | 5/2001 |
| JP | 2003-273513 A | 9/2003 |
| JP | 2005-116938 A | 4/2005 |
| JP | 2007-067364 A | 3/2007 |

OTHER PUBLICATIONS

Official Communication issued in International Patent Application No. PCT/JP2008/055496, mailed on Apr. 22, 2008.

* cited by examiner

*Primary Examiner*—Cathy Lam
(74) *Attorney, Agent, or Firm*—Keating & Bennett, LLP

(57) ABSTRACT

In a multilayer ceramic substrate having a cavity, base-material layers are arranged on a base side with respect to an interface between the base and a wall defining a cavity, and a constraining interlayer is arranged on the wall side. A conductive film is arranged between the base-material layers and the constraining interlayer, the base-material layers and the constraining interlayer sandwiching the interface. The effect of the first conductive film results in an increase in the adhesion of the constraining interlayer to the substrate layers, thus enhancing a shrinkage-inhibiting effect of the constraining interlayer.

5 Claims, 7 Drawing Sheets

MULTILAYER CERAMIC SUBSTRATE AND METHOD FOR PRODUCING SAME

BACKGROUND OF THE INVENTION

1. Field of the Invention

The present invention relates to a multilayer ceramic substrate and a method for producing the multilayer ceramic substrate. In particular, the present invention relates to a multilayer ceramic substrate produced by a non-shrinkage process, the multilayer ceramic substrate having a cavity.

2. Description of the Related Art

When a multilayer ceramic substrate is produced, a green laminate to be formed into a multilayer ceramic substrate is fired. When such a firing step is performed, the laminate inevitably shrinks. In particular, the occurrence of uneven shrinkage prevents a higher density of wiring in a multilayer ceramic substrate. Thus, it is important that the laminate does not shrink unevenly in the firing step.

To prevent the occurrence of such uneven shrinkage, a method for producing a multilayer ceramic substrate called a non-shrinkage process has been used. When a multilayer ceramic substrate is produced by the non-shrinkage process, constraining layers are arranged so as to sandwich a green laminate to be formed into a multilayer ceramic substrate. The constraining layers include an inorganic material powder that is not sintered at a firing temperature. Thus, the constraining layers prevent the shrinkage of the laminate in the firing step, and thus, prevent the occurrence of uneven shrinkage. The constraining layers are removed after the firing step.

However, when a multilayer ceramic substrate having a cavity is produced, even when the non-shrinkage process described above is used, the cavity, in particular, the periphery of the bottom of the cavity may be undesirably deformed so as to cause cracks and breaks in conductive lines in the multilayer ceramic substrate. The reason for this is as follows. Since the constraining layers are arranged on surfaces of a green laminate, the shrinkage-inhibiting function of the constraining layers is reduced as the distance from the opening of the cavity increases. Thus, the shrinkage rate is maximized at the farthest location from the opening, i.e., at the bottom of the cavity, which causes stress concentration. With respect to the depth of the cavity, the shrinkage rate at the bottom of the cavity is increased as the depth of the cavity increases.

To solve this problem, Japanese Unexamined Patent Application Publication No. 2003-273513 discloses that a constraining layer, i.e., a constraining interlayer, is arranged at an interface between green base-material layers defining a wall of a cavity of a green laminate. The constraining interlayer is not removed after the completion of a firing step. However, the constraining interlayer is solidified by the penetration of a portion of materials included in the base-material layers and remains in the completed multilayer ceramic substrate. The arrangement of the constraining interlayer in the wall of the cavity suppresses deformation, the formation of cracks, and breaks in conductive lines at the bottom of the cavity at which the shrinkage-inhibiting effect is reduced.

For example, when a multilayer ceramic substrate having a deep cavity is produced, even when the method described in Japanese Unexamined Patent Application Publication No. 2003-273513 is used, the shrinkage-inhibiting effect is insufficient at the bottom of the cavity. This may disadvantageously cause deformation, the formation of cracks, and breaks in the conductive lines at the periphery of the bottom of the cavity on which a shrinkage stress concentrates. To solve the foregoing problems, the shrinkage-inhibiting effect should be increased.

To increase the shrinkage-inhibiting effect of the constraining interlayer, an increase in the thickness of the constraining interlayer or an increase in the number of the constraining interlayers would appear to be effective. However, in the former, an inorganic material powder included in the constraining interlayer is densified and solidified by the penetration of glass and other materials contained in the base-material layers. Thus, the constraining interlayer should have a thickness to the extent that the inorganic material powder included in the constraining interlayer is solidified by the penetration of glass and other materials included in the base-material layers. This limits the amount that the thickness of the constraining interlayer can be increased. In fact, Japanese Unexamined Patent Application Publication No. 2003-273513 discloses a thickness of about 1 µm to about 2 µm. In the latter, also as described in Japanese Unexamined Patent Application Publication No. 2003-273513, when the constraining interlayers are arranged at all interfaces between the base-material layers, a reduction in the sinterability of the base-material layers is significant.

SUMMARY OF THE INVENTION

To overcome the problems described above, preferred embodiments of the present invention provide a multilayer ceramic substrate and a method for producing the multilayer ceramic substrate, which have an increased shrinkage-inhibiting effect.

A preferred embodiment of the present invention provides a multilayer ceramic substrate including a base and a wall defining a cavity having a bottom defining an upper main surface of the base. The multilayer ceramic substrate has a laminated structure including a plurality of stacked base-material layers and a constraining interlayer arranged along a specific interface between the base-material layers. Each of the base-material layers is made of a sintered body of a first powder including a glass material and a first ceramic material. The constraining interlayer includes a second powder including a second ceramic material that is not sintered at a temperature at which the glass material is melted and is in a state in which particles of the second powder are bonded by the diffusion or flow of a portion of the first powder including the glass material included in the base-material layers into the constraining interlayer during firing.

To overcome the problems described above, in preferred embodiments of the present invention, the base-material layers are arranged on the base side with respect to the interface between the base and the wall, and the constraining interlayer is arranged on the wall side with respect to the interface, and a first conductive film is arranged between the base-material layers and the constraining interlayer, the base-material layers and the constraining interlayer sandwiching the interface.

The first conductive film is preferably arranged along substantially the entire perimeter of the cavity.

Furthermore, the first conductive film is preferably arranged so as to extend partially to the bottom of the cavity. The first conductive film may preferably be arranged so as to cover substantially the entire surface of the bottom of the cavity.

When the first conductive film is not arranged to cover substantially the entire surface of the bottom of the cavity, a second conductive film may preferably be disposed on the bottom of the cavity separately from the first conductive film.

Preferably, the cavity may have a step with an upper surface facing upward in the approximate middle of the wall. In this case, preferably, the base-material layers are arranged below a plane extending from the upper face of the step, the constraining interlayer is arranged above the plane, and a third conductive film is arranged between the base-material layers and the constraining interlayer, the base-material layers and the constraining interlayer sandwiching the plane.

Additional constraining interlayer may preferably be arranged at an intermediate portion of the base and/or the wall in the stacking direction.

Another preferred embodiment of the present invention is directed to a method for producing a multilayer ceramic substrate, the method including a step of forming a green laminate including a base and a wall defining a cavity having a bottom defining an upper main surface of the base and a step of firing the green laminate.

The green laminate preferably has a laminated structure including a plurality of stacked base-material layers and a constraining interlayer located along a specific interface between the base-material layers, the base-material layers are arranged on the base side with respect to the interface between the base and the wall, the constraining interlayer is arranged on the wall side with respect to the interface, and a first conductive film is arranged between the base-material layers and the constraining interlayer, the base-material layers and the constraining interlayer sandwiching the interface.

The base-material layers include a first powder including a first ceramic material and a glass material or a glass component that can be melted and vitrified by firing to form a glass material. The constraining interlayer includes a second powder including a second ceramic material that is not sintered at a temperature at which the glass material is melted.

In the step of firing the green laminate described above, the green laminate is fired at a predetermined temperature such that particles of the second powder are not substantially sintered but are bonded by the diffusion or flow of a portion of the first powder including the glass material while at least a portion of the first powder is sintered.

The method for producing a multilayer ceramic substrate according to this preferred embodiment of the present invention may preferably further include a step of preparing a green surface-constraining layer including a third powder including a third ceramic material that is not sintered at a temperature at which the glass material is melted. In this case, the green laminate is in the state in which the surface-constraining layer is stacked and press-bonded on at least one main surface of the laminated structure including the base-material layers and the constraining interlayer, and the method further includes a step of removing the surface-constraining layer after the firing step.

The first conductive film is preferably arranged between the base-material layers and the constraining interlayer, the base-material layers and the constraining interlayer sandwiching the interface between the base and the wall defining the cavity. Thus, adhesion between the base-material layers and the constraining interlayer is increased in a portion at which the first conductive film is arranged, thereby increasing the shrinkage-inhibiting effect of the constraining interlayer. In addition, when a multilayer ceramic substrate having a deep cavity is produced, it is possible to increase the effect of inhibiting deformation, the formation of cracks, breaks in the conductive film, and other defects at the periphery of the bottom of the cavity.

The reason why the adhesion between the base-material layers and the constraining interlayer is improved by the first conductive film is believed to be as follows.

Typically, a multilayer ceramic substrate includes conductive films therein, and a metal element in the conductive films diffuses into base-material layers during firing. The metal element that diffuses into glass in the base-material layers functions as network-modifying ions in the glass, and thus, cleaves oxygen crosslinks forming the glass network, thereby reducing the viscosity of the glass. The reduction in the viscosity of the glass facilitates the penetration of the glass into the constraining interlayer. As a result, the adhesion between the constraining interlayer and the base-material layers is increased to improve the shrinkage-inhibiting effect of the constraining interlayer.

According to preferred embodiments of the present invention, the first conductive film is arranged at the periphery of the bottom of the cavity on which a shrinkage stress concentrates during the firing, i.e., the first conductive film is arranged between the base-material layers and the constraining interlayer, the base-material layers and the constraining interlayer sandwiching the interface between the base and the wall. Thus, the shrinkage-inhibiting effect of the constraining interlayer is increased at this portion. This suppresses deformation, the formation of cracks, breaks in the conductive film, and other defects at the periphery of the bottom of the cavity even in a multilayer ceramic substrate having a deep cavity.

The effect of inhibiting the formation of cracks and is particularly pronounced when the first conductive film is arranged along the entire perimeter of the cavity.

According to preferred embodiments of the present invention, the bottom of the cavity is preferably defined by the base-material layers. Thus, when the first conductive film is arranged to extend partially to the bottom of the cavity and when the second conductive film is disposed on the bottom of the cavity, these conductive films are arranged on the base-material layer, not on the constraining interlayer, thus improving the adhesion of the conductive films to the bottom of the cavity.

The step in the cavity is likely to cause the formation of cracks and other defects at the periphery of the upper surface of the step. Thus, the base-material layers are arranged below a plane extending from the upper surface of the step, the constraining interlayer is arranged above the plane, and a third conductive film is arranged between the base-material layers and the constraining interlayer, the base-material layers and the constraining interlayer sandwiching the plane. This structure increases the shrinkage-inhibiting effect of the constraining interlayer in contact with the third conductive film, thereby suppressing the formation of cracks and other defects described above. When the third conductive film is arranged to extend to the upper surface of the step, the adhesion strength of the third conductive film to the upper surface of the step is increased.

When a constraining interlayer is further arranged at an intermediate portion of the base and/or the wall in the stacking direction, shrinkage in the planar direction during the firing is suppressed at the portion where the constraining interlayer is arranged. This produces increased dimensional accuracy of the multilayer ceramic substrate and further prevents the formation of cracks.

In the method for producing a multilayer ceramic substrate according to preferred embodiments of the present invention, when the step of firing the green laminate is performed, the green laminate being in the state in which the surface-constraining layer is stacked and press-bonded on the laminated structure, the shrinkage during the firing is further suppressed, thereby providing greater dimensional accuracy of the multilayer ceramic substrate.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
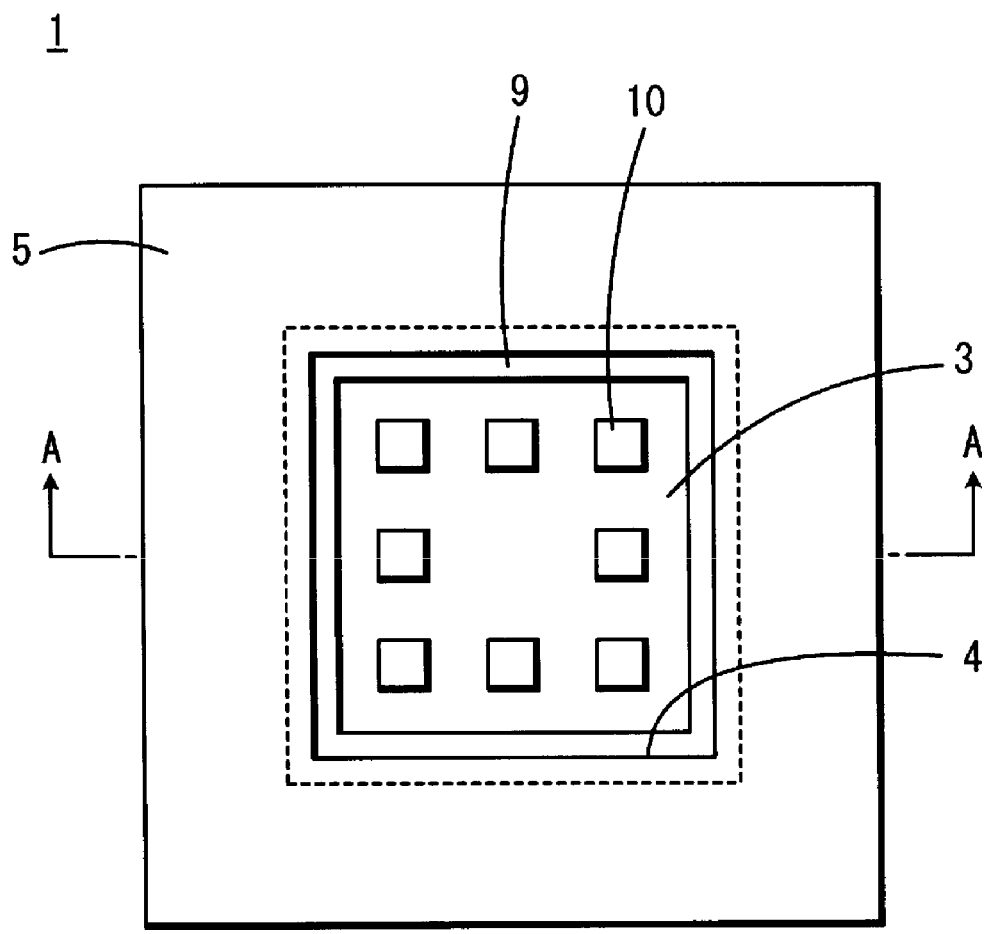
FIG. 1 is a plan view of a multilayer ceramic substrate according to a first preferred embodiment of the present invention.
Figure 2:
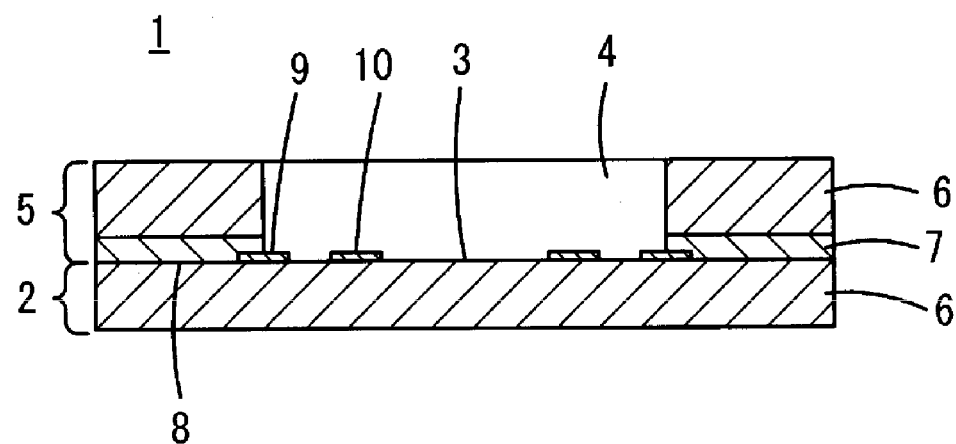
FIG. 2 is a cross-sectional view taken along line A-A in FIG. 1.

FIGS. 1 to 5 illustrate a first preferred embodiment of the present invention. FIG. 1 is a plan view of a multilayer ceramic substrate 1. FIG. 2 is a cross-sectional view taken along line A-A in FIG. 1.

The multilayer ceramic substrate 1 includes a base 2 and a wall 5 defining a cavity 4 having a bottom 3 defined by the upper main surface of the base 2. The multilayer ceramic substrate 1 has a laminated structure including a plurality of stacked base-material layers 6 and a constraining interlayer 7 arranged along a specific interface between the base-material layers 6. In this figure, the base-material layers 6 located at the base 2, the base-material layers 6 located at the wall 5, and the constraining interlayer 7 are each shown as a single layer for convenience of drawing. In fact, to obtain a required thickness for each component, it is common to stack a plurality of layers.

The base-material layers 6 are made of a sintered body of a first powder including a glass material and a first ceramic material. The constraining interlayer 7 includes a second powder including a second ceramic material that is not sintered at a temperature at which the glass material is melted. The particles of the second powder are bonded by the diffusion or flow of a portion of the first powder including the glass material in the base-material layers 6 into the constraining interlayer 7 during firing.

The base-material layers 6 are arranged on the base 2 side, and the constraining interlayer 7 is arranged on the wall 5 side, with respect to an interface 8 located between the base 2 and the wall 5. A first conductive film 9 is arranged between the base-material layers 6 and the constraining interlayer 7, the base-material layers 6 and the constraining interlayer 7 sandwiching the interface 8. In this preferred embodiment, as shown in FIG. 1, the first conductive film 9 is arranged along substantially the entire perimeter of the cavity 4. The first conductive film 9 is arranged not only inside the multilayer ceramic substrate 1 but also on a portion of the bottom 3 of the cavity 4.

Preferred embodiments of the present invention effectively inhibit the formation of cracks at the periphery of the bottom 3 of the cavity 4 even when the cavity 4 is relatively deep, as described in an experimental example below. Preferably, the aspect ratio is in the range of about 0.4 to about 1, for example.

Figure 3:
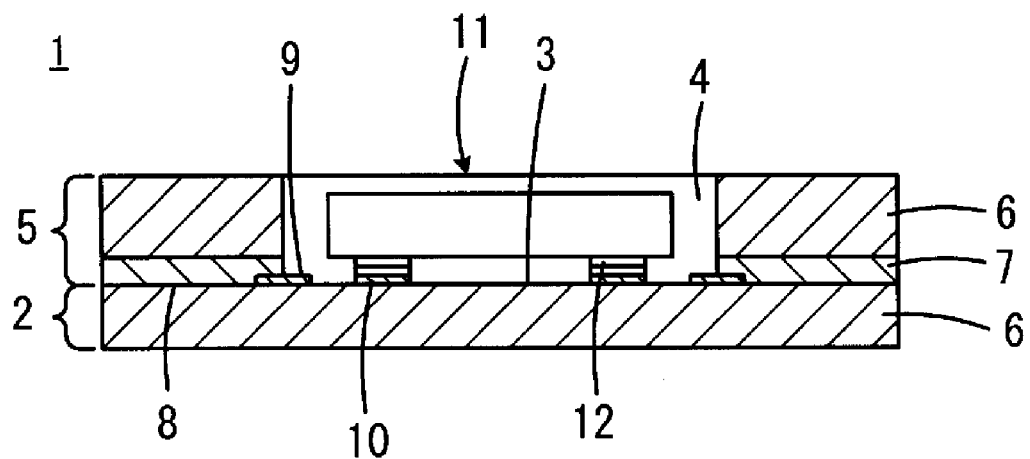
FIG. 3 is a drawing corresponding to FIG. 2 and illustrates a state in which a chip component is mounted in a cavity of a multilayer ceramic substrate.

FIG. 3 illustrates the multilayer ceramic substrate 1 including the cavity 4 in which a chip component 11 is mounted. Second conductive films 10 are arranged on the bottom 3 of the cavity 4 in addition to the first conductive film 9. The second conductive films 10 are electrically connected to terminal electrodes 12 of the chip component 11.

Figure 4:
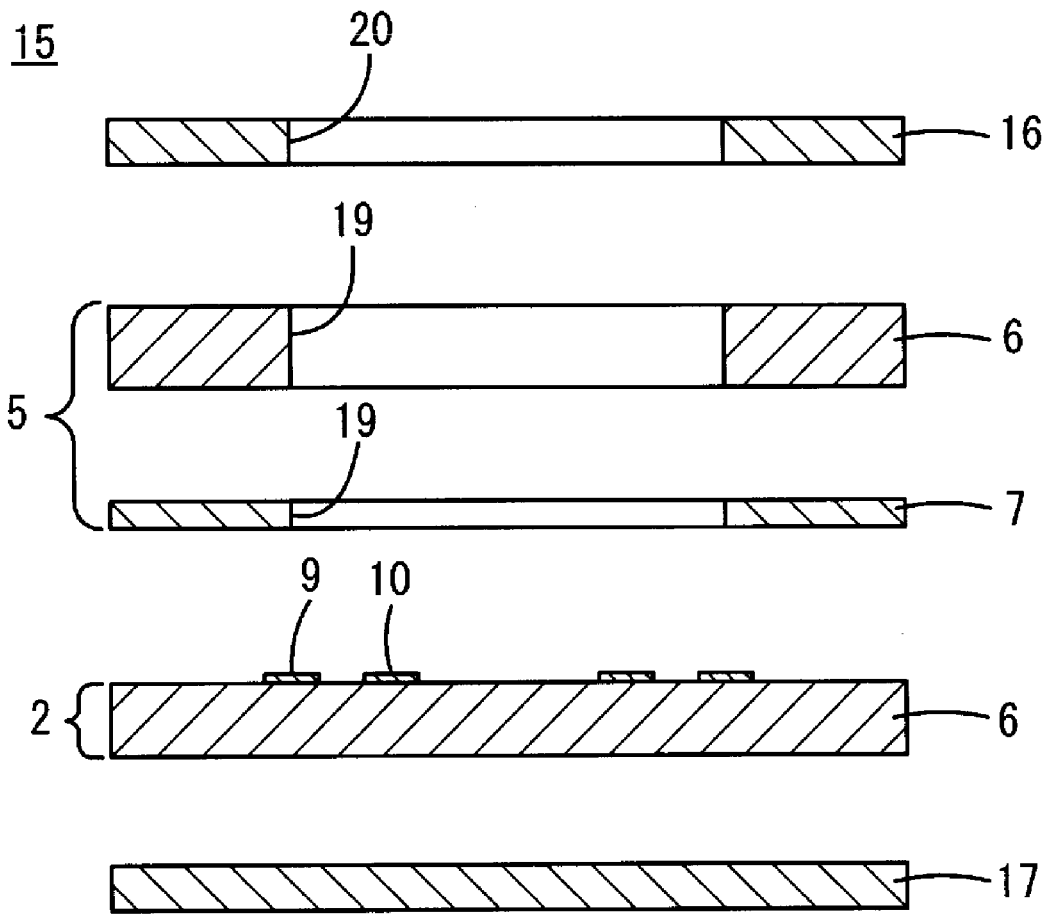
FIG. 4 illustrates a method for producing the multilayer ceramic substrate shown in FIGS. 1 and 2 and an exploded cross-sectional view of elements defining a green laminate.
Figure 5:
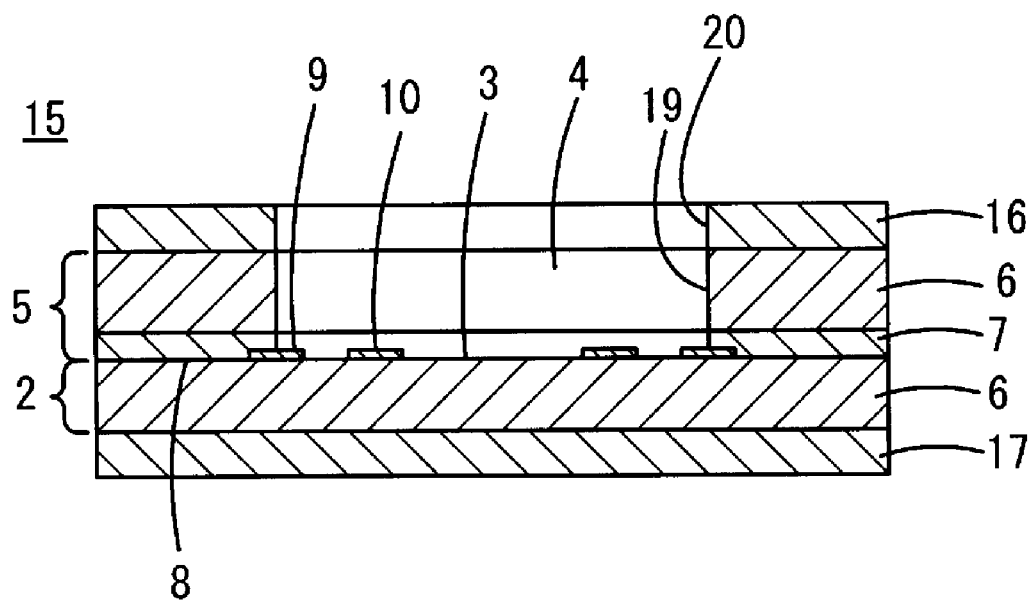
FIG. 5 is a cross-sectional view of the green laminate formed by stacking the elements shown in FIG. 4.

FIGS. 4 and 5 illustrate a method for producing the multilayer ceramic substrate 1 according to a preferred embodiment of the present invention.

To produce the multilayer ceramic substrate 1, a green laminate 15 as shown in FIG. 5 is formed and then fired. The green laminate 15 has a green laminated structure corresponding to the laminated structure of the multilayer ceramic substrate 1.

Specifically, the green laminate 15 includes the base 2 and the wall 5 defining cavity 4 having the bottom 3 defined by the upper main surface of the base 2. The green laminate 15 has a laminated structure including the plurality of stacked base-material layers 6 and the constraining interlayer 7 located along a specific interface between the base-material layers 6. The base-material layers 6 are arranged on the base 2 side, and the constraining interlayer 7 is arranged on the wall 5 side, with respect to an interface 8 located between the base 2 and the wall 5. The first conductive film 9 is arranged between the base-material layers 6 and the constraining interlayer 7, the base-material layers 6 and the constraining interlayer 7 sandwiching the interface 8. The second conductive films 10 are arranged on the bottom 3 of the cavity 4.

The green laminate 15 further includes surface constraining layers 16 and 17 stacked on the upper main surface and the lower main surface, of the green laminate structure corresponding to the structure of the multilayer ceramic substrate 1.

In the green laminate 15, the base-material layers 6 include the first powder including the first ceramic material and the glass material or a glass component that can be melted and vitrified by firing to form a glass material. The constraining interlayer 7 includes the second powder including the second ceramic material that is not sintered at a temperature at which the glass material is melted. The constraining interlayer 7 may include a glass material or a glass component that can be melted and vitrified by firing to form a glass material to the extent that the constraining force is not adversely affected. For example, a borosilicate glass is preferably used as the glass material contained in the base-material layers 6, for example, and alumina is preferably used as the first ceramic material, for example. As the second ceramic material included in the constraining interlayer 7, for example, one of alumina, magnesium oxide, zirconium oxide, silicon oxide, or titanium oxide is preferably used.

In the green laminate 15, each of the surface constraining layers 16 and 17 includes a third powder including a third ceramic material that is not sintered at a temperature at which the glass material included in the base-material layers 6 is melted. For example, as the third ceramic material included in the surface constraining layers 16 and 17, one of alumina, magnesium oxide, zirconium oxide, silicon oxide, or titanium oxide is preferably used. That is, the same material as the second ceramic material contained in the constraining interlayer 7 may preferably be used.

To form the green laminate 15, a stacking step illustrated with reference to FIG. 4 is performed. FIG. 4 is an exploded view showing elements defining the green laminate 15. Each of the base-material layers 6, the constraining interlayer 7, and the surface constraining layers 16 and 17 shown in FIG. 4 preferably include one or more green sheets having a predetermined composition. To obtain a predetermined thickness, a plurality of green sheets are preferably used as required.

The green sheets described above are prepared. A through hole 19 to be formed into the cavity 4 is formed in each of the green sheets defining the wall 5. The green sheets to be formed into the surface constraining layer 16 are prepared. A through hole 20 that will communicate with an opening of the cavity 4 is formed in each of the green sheets.

The green sheets to be formed into the base 2 are prepared. The green sheets to be formed into the surface constraining layer 17 are prepared. The first and second conductive films 9 and 10 are formed on the uppermost green sheet of the green sheets to be formed into the base 2, by applying a conductive paste preferably including, for example, silver as a conductive component by printing.

The plurality of green sheets described above are stacked in a predetermined order and press-bonded to produce the green laminate 15 shown in FIG. 5. The resulting green laminate 15 is fired to form the sintered multilayer ceramic substrate 1. The surface constraining layers 16 and 17 are removed after the sintering. Alternatively, the particles of the third powder included in the surface constraining layer 16 or 17 are bonded by the diffusion or flow of the glass material included in the base-material layers 6 in contact with the surface constraining layer 16 or 17, and the surface constraining layer 16 or 17 remaining as the surface of the multilayer ceramic substrate 1 without removing the surface constraining layer 16 or 17.

In the foregoing firing step, the constraining interlayer 7 and the surface constraining layers 16 and 17 have a shrinkage-inhibiting effect on the base-material layers 6 being in contact with these layers and suppress undesired deformation of the multilayer ceramic substrate 1. In particular, the first conductive film 9 is arranged between the base-material layers 6 and the constraining interlayer 7 of the multilayer ceramic substrate 1, the base-material layers 6 and the constraining interlayer 7 sandwiching the interface 8 between the base 2 and the wall 5, and the first conductive film 9 increases the adhesion between the base-material layers 6 and the constraining interlayer 7. This increases the shrinkage-inhibiting effect of the constraining interlayer 7, thereby effectively inhibiting, for example, deformation, the formation of cracks, and breaks in the conductive film, which are likely to occur at the periphery of the bottom 3 of the cavity 4 on which a shrinkage stress concentrates during the firing.

According to this preferred embodiment, the shrinkage-inhibiting effect is also provided by the surface constraining layers 16 and 17, thus improving the dimensional accuracy of the multilayer ceramic substrate 1.

Instead of the production method described above, a production method described below may be used.

A plurality of green sheets defining the wall 5 are stacked. A through hole to be formed into the cavity 4 is formed in the resulting green sheet stack in a single operation. Separately, green sheets defining the base 2 are stacked. The green sheet stack to be formed into the wall 5 and the green sheet stack to be formed into the base 2 are laminated. Surface constraining layers are stacked as required. The resulting stack is press-bonded to form a green laminate.

Figure 6:
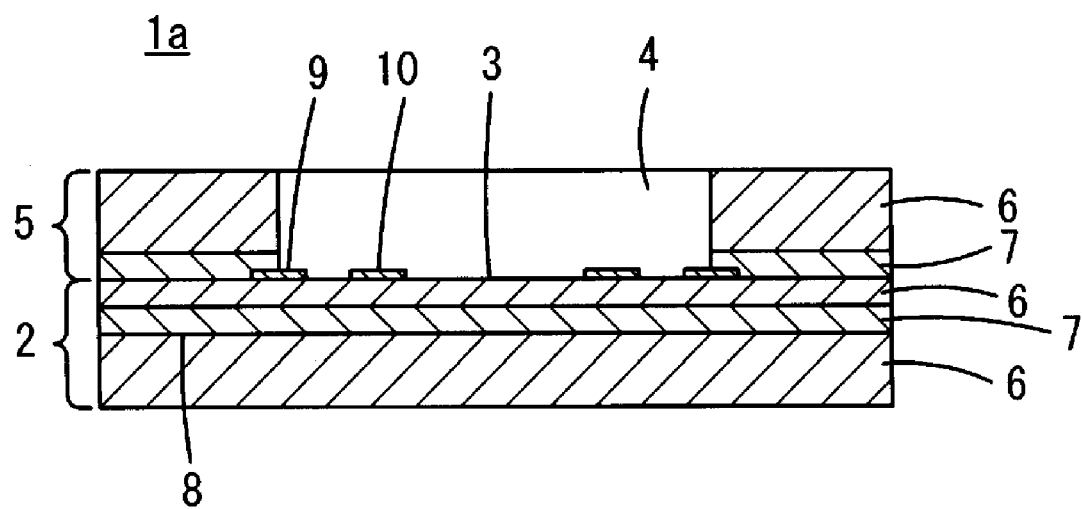
FIG. 6 is a plan view of a multilayer ceramic substrate according to a second preferred embodiment of the present invention.

FIG. 6 shows a multilayer ceramic substrate 1a according to a second preferred embodiment of the present invention and corresponds to FIG. 2. In FIG. 6, elements that are substantially the same as those shown in FIG. 2 are designated using the same reference numerals, and a redundant description thereof is omitted.

In the multilayer ceramic substrate 1a shown in FIG. 6, the constraining interlayers 7 are arranged not only at the wall 5 side of the interface between the base 2 and the wall 5 but also at an intermediate portion in the base 2 in the stacking direction. According to the second preferred embodiment, the shrinkage of a large portion in the planar direction can be inhibited in the firing step of producing the multilayer ceramic substrate 1a as compared to the first preferred embodiment, thus improving the dimensional accuracy of the multilayer ceramic substrate 1a and more effectively inhibiting the formation of cracks. In particular, when the constraining interlayer 7 arranged at the intermediate portion of the base 2 in the stacking direction is located adjacent to the bottom 3 of the cavity 4 as shown in FIG. 6, the inhibition of the formation of cracks is further increased.

Figure 7:
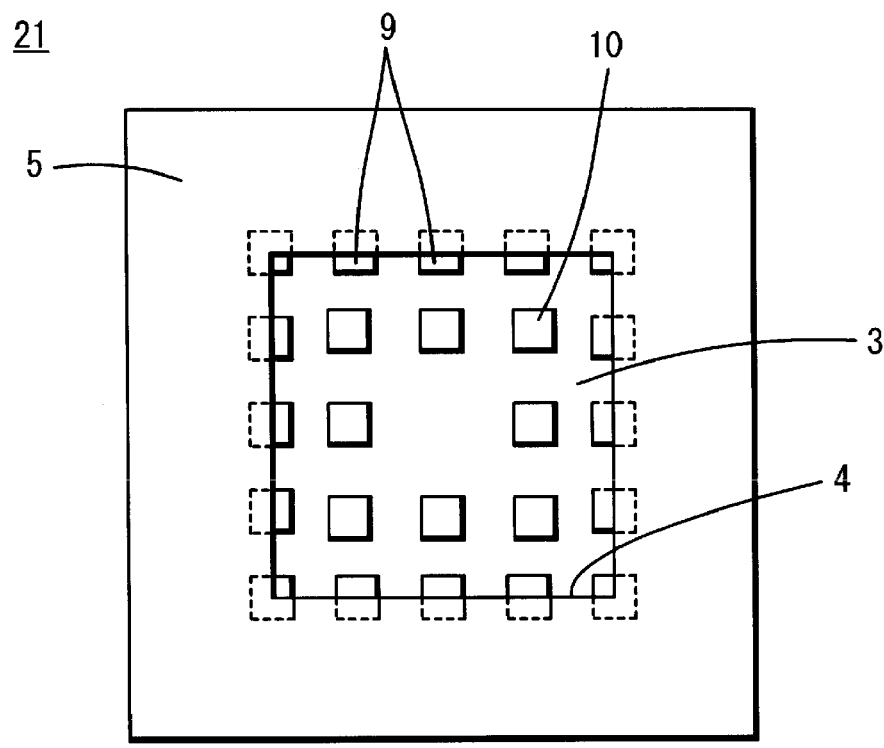
FIG. 7 is a plan view of a multilayer ceramic substrate according to a third preferred embodiment of the present invention.

FIG. 7 illustrates a multilayer ceramic substrate 21 according to a third preferred embodiment of the present invention and corresponds to FIG. 1. In FIG. 7, elements that are substantially the same as those shown in FIG. 1 are designated using the same reference numerals, and a redundant description thereof is omitted.

In the multilayer ceramic substrate 21 shown in FIG. 7, the first conductive film 9 is discontinuously arranged along the perimeter of the cavity 4. Unlike the first conductive film 9 shown in FIG. 1, although the first conductive film 9 is not continuously arranged along substantially the entire perimeter of the cavity 4, the first conductive film 9 adequately increases adhesion between the substrate layers 6 and the constraining interlayer 7 during firing.

Figure 8:
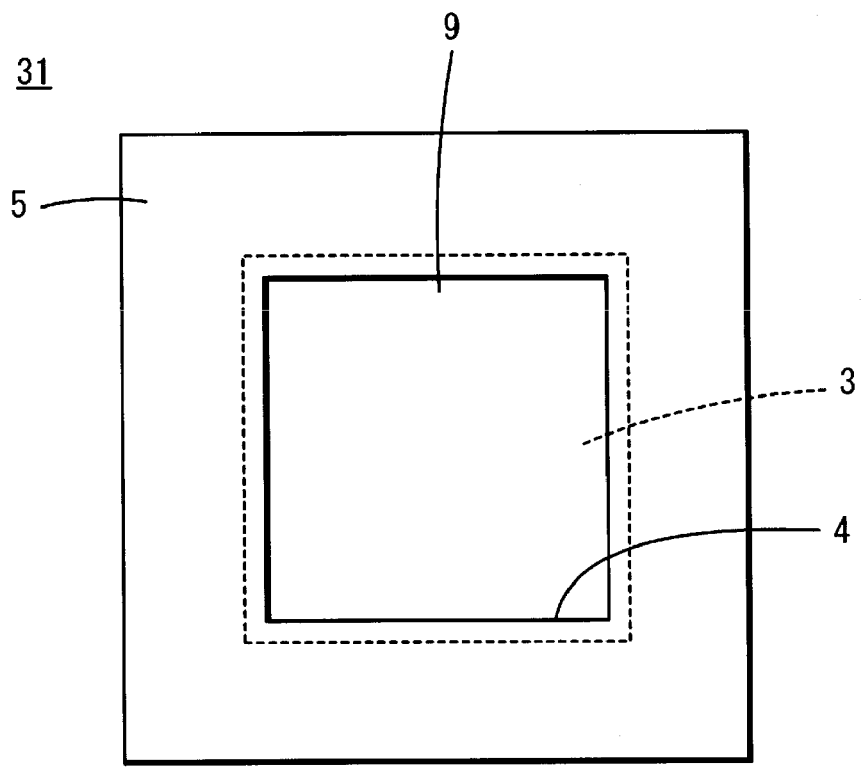
FIG. 8 is a plan view of a multilayer ceramic substrate according to a fourth preferred embodiment of the present invention.
Figure 9:
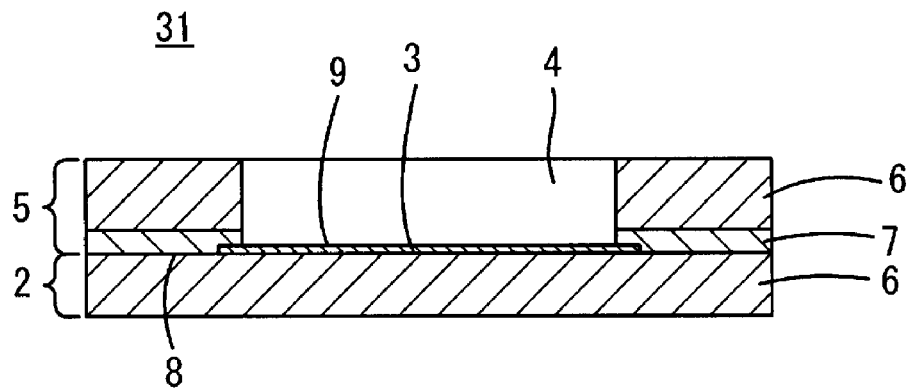
FIG. 9 is a cross-sectional view of the multilayer ceramic substrate shown in FIG. 8.

FIGS. 8 and 9 illustrate a fourth preferred embodiment of the present invention. FIG. 8 corresponds to FIG. 1. FIG. 9 corresponds to FIG. 2. In FIGS. 8 and 9, elements that are substantially the same as those in FIGS. 1 and 2 are designated using the same reference numerals, and a redundant description thereof is omitted.

In the multilayer ceramic substrate 31 according to the fourth preferred embodiment, the first conductive film 9 is arranged so as to cover substantially the entire surface of the bottom 3 of the cavity 4. The first conductive film 9 has the substantially same effect of increasing adhesion between the substrate layers 6 and the constraining interlayer 7 as in the multilayer ceramic substrate 1 according to the first preferred embodiment. In this preferred embodiment, the first conductive film 9 has a large area and is thus suitably used as a conductive film connected to a ground potential.

Figure 10:
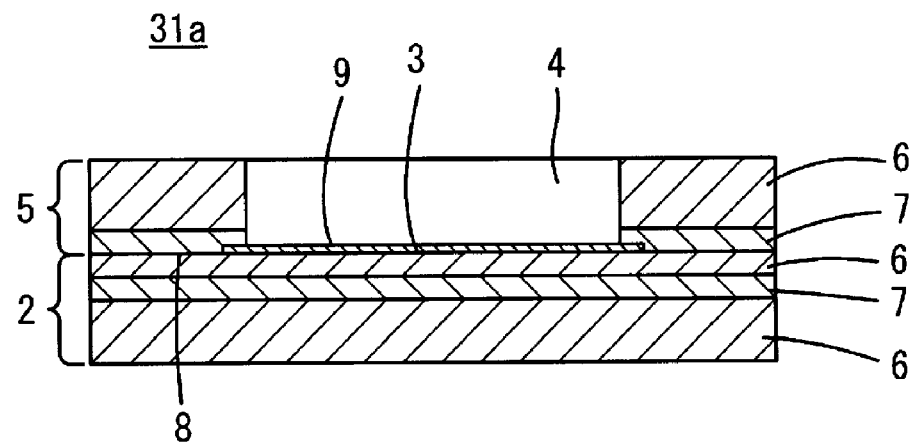
FIG. 10 is a plan view of a multilayer ceramic substrate of a fifth preferred embodiment of the present invention.

FIG. 10 illustrates a multilayer ceramic substrate 31a according to a fifth preferred embodiment of the present invention and corresponds to FIG. 9. In FIG. 10, elements that are substantially the same as those shown in FIG. 9 are designated using the same reference numerals, and a redundant description thereof is omitted.

In the multilayer ceramic substrate 31a shown in FIG. 10, the constraining interlayers 7 are arranged not only at the wall 5 side of the interface between the base 2 and the wall 5 but also at an intermediate portion in the base 2 in the stacking direction in the same manner as in the multilayer ceramic substrate 1a shown in FIG. 6. According to the fifth preferred embodiment, the shrinkage of a large portion in the planar direction can be inhibited in the firing step of producing the multilayer ceramic substrate 31a as compared to the fourth preferred embodiment, thereby improving the dimensional accuracy of the multilayer ceramic substrate 31a and more effectively inhibiting the formation of cracks. In particular, when the constraining interlayer 7 arranged at the intermediate portion of the base 2 in the stacking direction is located adjacent to the bottom 3 of the cavity 4 as shown in FIG. 10, the effect of inhibiting the formation of cracks is further increased.

Figure 11:
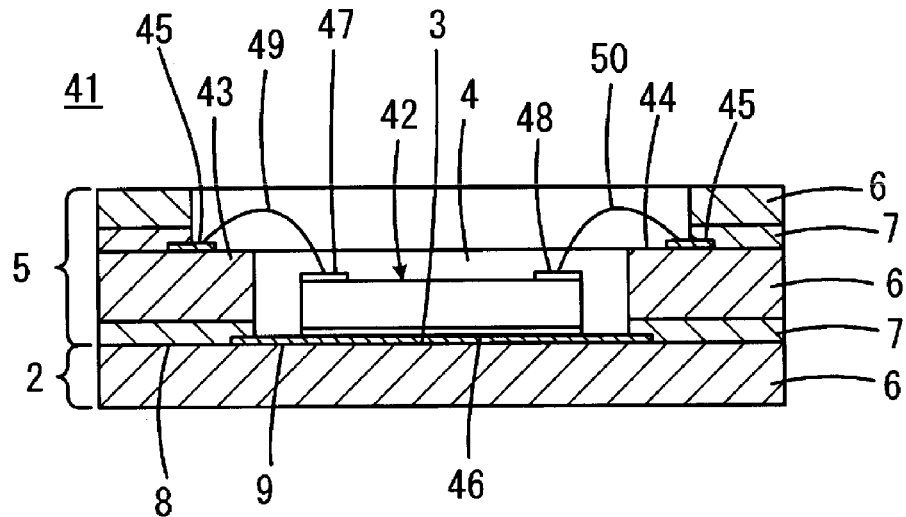
FIG. 11 is a cross-sectional view of a multilayer ceramic substrate according to a sixth preferred embodiment of the present invention.

FIG. 11 is a cross-sectional view of a multilayer ceramic substrate 41 according to a sixth preferred embodiment of the present invention. FIG. 11 shows a state in which a chip component 42 is mounted in the cavity 4 in the same manner as in FIG. 3. In FIG. 11, elements that are substantially the same as those in FIG. 1 to 3 are designated using the same reference numerals, and a redundant description thereof is omitted.

In the multilayer ceramic substrate 41 shown in FIG. 11, a step 43 is provided in the cavity 4. The step 43 has an upper surface 44 facing upward in the approximate middle of the wall 5. The base-material layers 6 is arranged below a plane extending from the upper surface 44 of the step 43, and the constraining interlayer 7 is arranged above the plane. A third conductive film 45 is arranged between the base-material layers 6 and the constraining interlayer 7, the base-material layers 6 and the constraining interlayer 7 sandwiching the upper surface 44 of the step 43. The third conductive film 45 may be arranged along substantially the entire perimeter of the cavity 4 in substantially the same manner as the first conductive film 9 shown in FIG. 1 (not shown in detail). Alternatively, the third conductive film 45 may be discontinuously arranged along the perimeter of the cavity 4 in substantially the same manner as the first conductive films 9 shown in FIG. 7.

In the multilayer ceramic substrate 41, the first conductive film 9 is preferably arranged so as to cover substantially the entire surface of the bottom 3 of the cavity 4 as in FIG. 8.

A chip component 42 is mounted in the cavity 4 as described above. The chip component 42 has a terminal electrode 46 on the lower surface thereof. The terminal electrode 46 is electrically connected to the first conductive film 9. Thus, the chip component 42 is electrically connected to a ground potential and mechanically fixed. The chip component 42 includes terminal electrodes 47 and 48 on the upper surface thereof. The terminal electrodes 47 and 48 are electrically connected to the third conductive film 45 via the bonding wires 49 and 50. The third conductive film 45 arranged so as to extend to the upper surface of the step 43 has a shape suitable for wire bonding.

Figure 12:
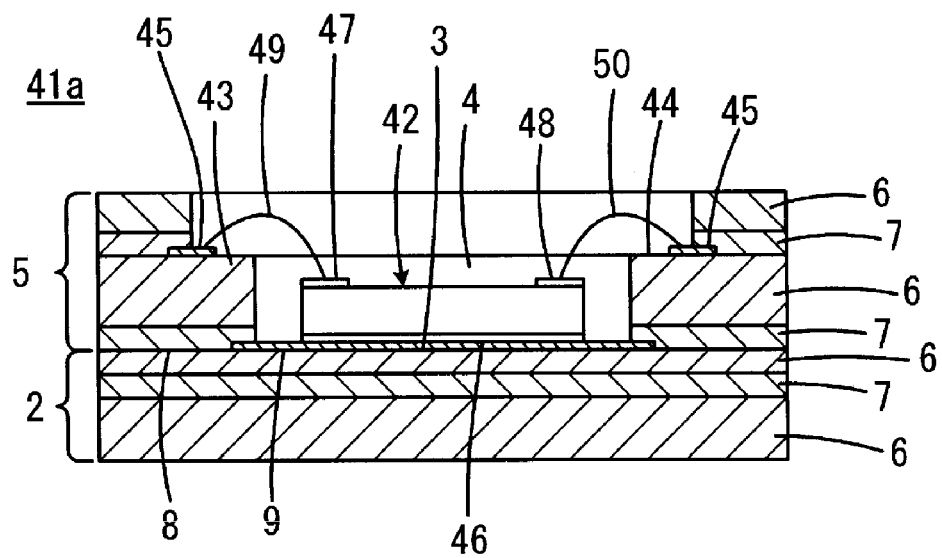
FIG. 12 is a cross-sectional view of a multilayer ceramic substrate according to a seventh preferred embodiment of the present invention.

FIG. 12 illustrates a multilayer ceramic substrate 41a according to a seventh preferred embodiment of the present invention and corresponds to FIG. 11. In FIG. 12, elements that are substantially the same as those in FIG. 11 are designated using the same reference numerals, and a redundant description thereof is omitted.

In the multilayer ceramic substrate 41a shown in FIG. 12, the constraining interlayers 7 are arranged not only at the wall 5 side of the interface between the base 2 and the wall 5, but also at an intermediate portion in the base 2 in the stacking direction in substantially the same manner as in the multilayer ceramic substrate 1a shown in FIG. 6 and the multilayer ceramic substrate 31a shown in FIG. 10. According to the seventh preferred embodiment, the shrinkage of a large portion in the planar direction is inhibited in the firing step of producing the multilayer ceramic substrate 31a as compared to the sixth preferred embodiment, thereby improving the dimensional accuracy of the multilayer ceramic substrate 31a and more effectively inhibiting the formation of cracks. In particular, when the constraining interlayer 7 arranged at the intermediate portion of the base 2 in the stacking direction is located adjacent to the bottom 3 of the cavity 4, as shown in the FIG. 12, the inhibition of the formation of cracks is further improved.

Figure 13:
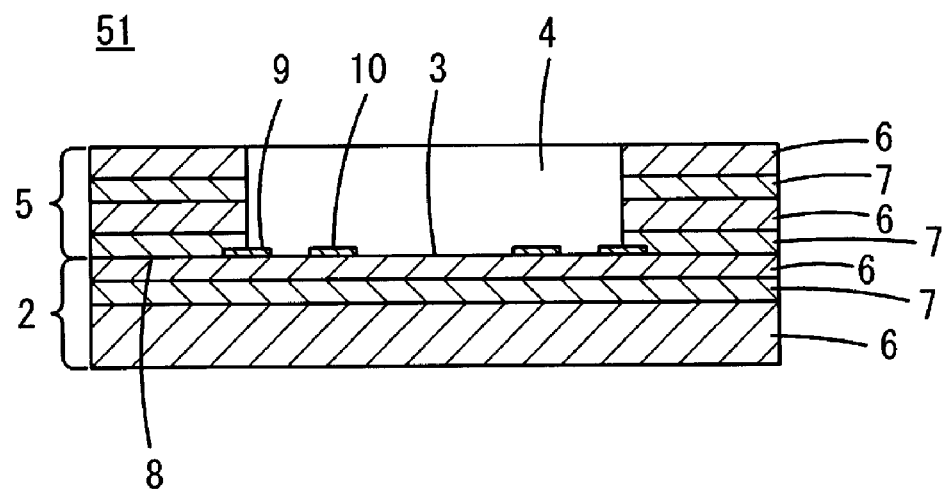
FIG. 13 is a cross-sectional view of a multilayer ceramic substrate according to an eighth preferred embodiment of the present invention.

FIG. 13 illustrates a multilayer ceramic substrate 51 according to an eighth preferred embodiment of the present invention and corresponds to FIG. 2. In FIG. 13, elements that are substantially the same as those in FIG. 2 are designated using the same reference numerals, and a redundant description thereof is.

In the multilayer ceramic substrate 51 shown in FIG. 13, the constraining interlayers 7 are arranged at the wall 5 side of the interface between the base 2 and the wall 5, an intermediate portion in the base 2 in the stacking direction, and an intermediate portion in the wall 5 in the stacking direction. According to this preferred embodiment, the shrinkage of a large portion in the planar direction is inhibited in the firing step of producing the multilayer ceramic substrate 51 as compared to the second preferred embodiment, thereby enhancing the dimensional accuracy of the multilayer ceramic substrate 51 and more effectively inhibiting the formation of cracks.

An experiment was conducted to verify the effects of various preferred embodiments of the present invention will be described below.

Figure 14:
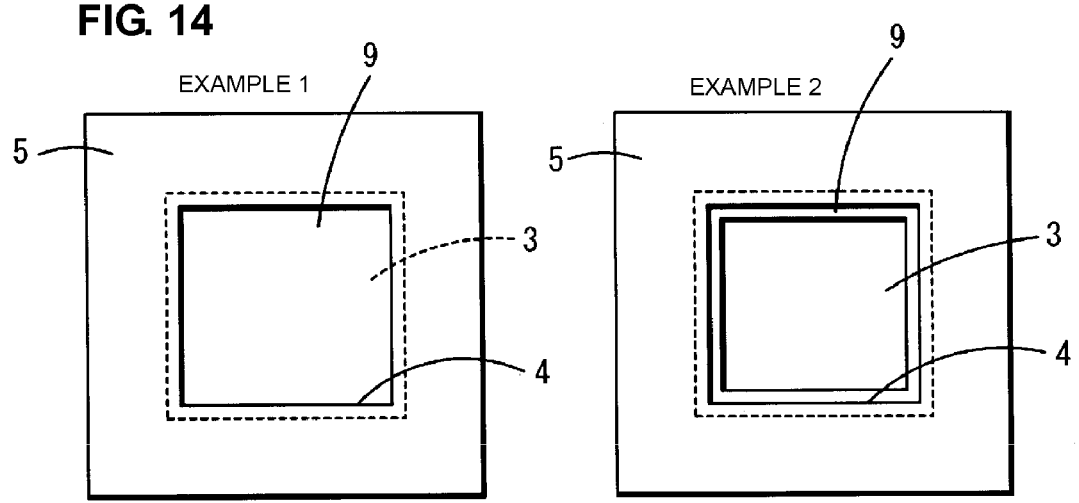
FIG. 14 includes plan views of multilayer ceramic substrates produced in Examples 1 and 2 and Comparative Examples 1 and 2 of an experimental example.
Figure 14:
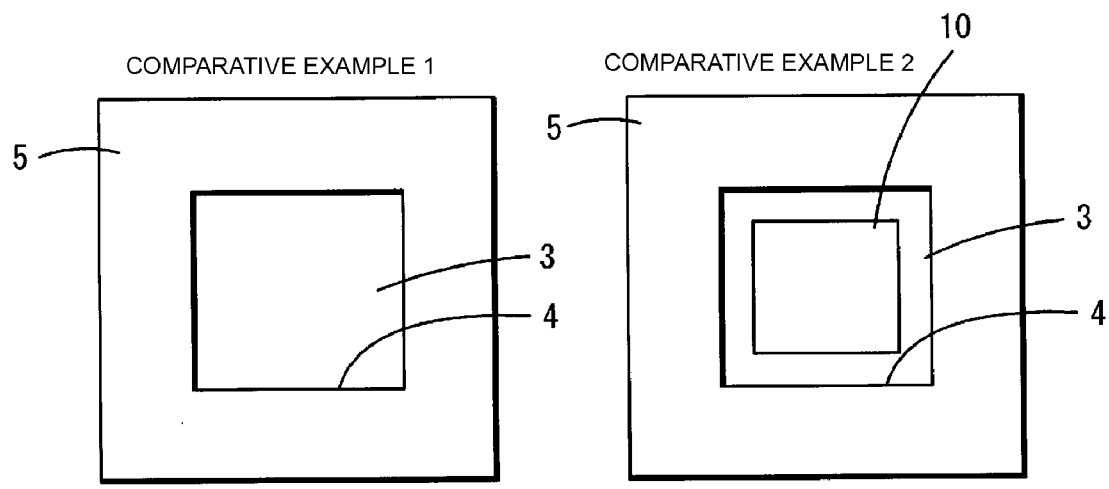

In this experiment, multilayer ceramic substrates according to Examples 1 and 2 and Comparative Examples 1 and 2 as shown in the plan views of FIG. 14 were produced. In FIG. 14, elements that are substantially the same as those shown in FIG. 1 are designated using the same reference numerals.

The structures of these samples will be described. (1) A multilayer ceramic substrate according to Example 1 includes substantially the same structure as the multilayer ceramic substrate 31 according to the fourth preferred embodiment described with reference to FIGS. 8 and 9. (2) A multilayer ceramic substrate according to Example 2 includes substantially the same structure as the multilayer ceramic substrate 1 according to the first preferred embodiment described with reference to FIGS. 1 and 2, except that the second conductive films 10 are not provided. (3) A multilayer ceramic substrate according to Comparative Example 1 does not include the first conductive film or the second conductive film. (4) A multilayer ceramic substrate according to Comparative Example 2 does not include the first conductive film 9 but does include the second conductive film 10 having a shape similar to the cavity 4.

As a method for producing the multilayer ceramic substrates according to Examples 1 and 2 and Comparative Examples 1 and 2, substantially the same production method as the production method described with reference to FIGS. 4 and 5 was used.

In this production method, green sheets for forming the base-material layers were formed as follows: about 60 parts by weight of a borosilicate glass powder having an average particle size of about 4 μm, about 40 parts by weight of an alumina powder having an average particle size of about 0.35 μm, about 50 parts by weight of water which functions as a dispersion medium, about 20 parts by weight of polyvinyl alcohol which functions as a binder, and 1 part by weight of a polycarboxylic acid-based dispersant which functions as a dispersant were mixed to form a slurry. After the removal of bubbles from the slurry, the slurry was formed into sheets by a doctor blade method. The resulting sheets were dried to form green sheets each having a thickness of about 100 μm (a thickness of about 50 μm after firing).

Green sheets to form the constraining layers were formed as follows: about 100 parts by weight of an alumina powder having an average particle size of about 0.4 μm, about 50 parts by weight of water which functions as a dispersion medium, about 20 parts by weight of polyvinyl alcohol which functions as a binder, and about 1 part by weight of a polycarboxylic acid-based dispersant which functions as a dispersant were mixed to form a slurry. After the removal of bubbles from the slurry, the slurry was formed into sheets by a doctor blade method. The resulting sheets were dried to form green sheets, each having a thickness of about 5 μm, for forming the constraining interlayers and to form green sheets, each having a thickness of about 300 μm, for forming the surface constraining layers.

A conductive paste for the conductive films was prepared, the conductive paste including about 48 parts by weight of a silver powder having an average particle size of about 2 μm, about 3 parts by weight of ethyl cellulose which functions as a binder, and about 49 parts by weight of a terpene which functions as a solvent. The conductive films 9 and 10 as shown in FIG. 14 were formed using the conductive paste.

During stacking the green sheets in each of Examples 1 and 2 and Comparative Examples 1 and 2, six green sheets for forming the base-material layers were stacked to define the base. With respect to the green sheets for forming base-material layers defining the wall, three types of samples were formed: 12 green sheets were stacked to provide the cavity having a depth of about 0.6 mm after firing; 16 green sheets were stacked to provide the cavity having a depth of about 0.8 mm after firing; and 20 green sheets were stacked to provide the cavity having a depth of about 1 mm after firing.

Each of the resulting multilayer ceramic substrates was evaluated for the presence or absence of a crack at the periphery of the bottom of the cavity thereof by observation of the cross section of the samples. Ten specimens of each sample were evaluated. The number of specimens in which a crack had formed was determined. Table 1 shows the proportion of the number of specimens in which a crack formed in 10 specimens, i.e., the crack formation rate.

TABLE 1

|  | Cavity depth | | |
| --- | --- | --- | --- |
|  | 0.6 mm | 0.8 mm | 1 mm |
| Comparative Example 1 | 70% | 100% | 100% |
| Comparative Example 2 | 70% | 100% | 100% |
| Example 1 | 0% | 0% | 0% |
| Example 2 | 0% | 0% | 0% |

Table 1 clearly shows that in each of Comparative Examples 1 and 2, a crack forms in any cavity depth, and the crack formation rate increased with increasing cavity depth.

In contrast, in Examples 1 and 2, no cracks formed even at a cavity depth of about 1 mm.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer ceramic substrate comprising:
   a base and a wall defining a cavity including a bottom surface defined by an upper main surface of the base; and
   a laminated structure including a plurality of stacked base-material layers and a constraining interlayer arranged along a specific interface between the base-material layers; wherein
   each of the base-material layers is defined by a sintered body including a first powder including a glass material and a first ceramic material;
   the constraining interlayer includes a second powder including a second ceramic material that is not sintered at a temperature at which the glass material is melted and is in a state in which particles of the second powder are bonded by diffusion or flow of a portion of the first powder including the glass material in the base-material layers into the constraining interlayer during firing;
   the constraining interlayer is arranged at an interface between the wall and the base;
   a first conductive film is arranged between the base and the constraining interlayer;
   the first conductive film is arranged along substantially an entire perimeter of the cavity; and
   the first conductive film is arranged to extend from between the base and the wall to a portion of the bottom surface of the cavity.

2. The multilayer ceramic substrate according to claim 1, wherein the first conductive film is arranged so as to cover substantially the entire bottom surface of the cavity.

3. The multilayer ceramic substrate according to claim 1, further comprising a second conductive film arranged on the bottom surface of the cavity separately from the first conductive film.

4. The multilayer ceramic substrate according to claim 1, wherein the cavity includes a step including an upper surface facing upward in an approximate middle portion of the wall, one of the base-material layers is arranged below a plane extending along the upper surface of the step, another constraining interlayer is arranged above the plane, and a third conductive film is arranged between the one of the base-material layers and the another constraining interlayer.

5. The multilayer ceramic substrate according to claim 1, further comprising another constraining interlayer arranged on at least one of an intermediate portion of the base and an intermediate portion of the wall in a stacking direction of the base-material layers.

* * * * *